United States Patent
Liu et al.

(10) Patent No.: US 9,017,792 B2
(45) Date of Patent: Apr. 28, 2015

(54) TRI-BARRIER CERAMIC COATING

(75) Inventors: Lucy Yourong Liu, Hillsdale, NJ (US);
Paul Lawton, Rock Hill, NY (US);
Patricia Lawton, legal representative,
Rockhill, NY (US)

(73) Assignee: Chromalloy Gas Turbine LLC,
Orangeburg, NY (US)

( * ) Notice: Subject to any disclaimer, the term of this patent is extended or adjusted under 35 U.S.C. 154(b) by 508 days.

(21) Appl. No.: 13/066,974

(22) Filed: Apr. 30, 2011

(65) Prior Publication Data

US 2012/0276352 A1  Nov. 1, 2012

(51) Int. Cl.
*B32B 18/00* (2006.01)
*B32B 7/02* (2006.01)
*C23C 14/30* (2006.01)
*C04B 35/486* (2006.01)
*C23C 14/08* (2006.01)
*F01D 5/28* (2006.01)
*C23C 14/24* (2006.01)

(52) U.S. Cl.
CPC ....... *C04B 35/486* (2013.01); *Y10T 428/24967* (2015.01); *C04B 2235/3224* (2013.01); *C04B 2235/3225* (2013.01); *C04B 2235/79* (2013.01); *C23C 14/083* (2013.01); *C23C 14/24* (2013.01); *F01D 5/288* (2013.01); *F01D 5/284* (2013.01)

(58) Field of Classification Search
USPC .............................................. 428/215, 312.8
See application file for complete search history.

(56) References Cited

U.S. PATENT DOCUMENTS

| | | | |
|---|---|---|---|
| 5,350,599 A | 9/1994 | Rigney et al. | |
| 5,683,825 A | 11/1997 | Bruce et al. | |
| 5,714,202 A | 2/1998 | Lemelson et al. | |
| 5,792,521 A | 8/1998 | Wortman | |
| 6,054,184 A | 4/2000 | Bruce et al. | |
| 6,982,126 B2 | 1/2006 | Darolia et al. | |
| 7,008,674 B2 | 3/2006 | Nagaraj et al. | |
| 7,041,383 B2 | 5/2006 | Liu et al. | |
| 7,150,926 B2 | 12/2006 | Strangman | |
| 7,211,338 B2 | 5/2007 | Strangman | |
| 7,282,271 B2 | 10/2007 | Strangman et al. | |
| 7,416,788 B2 | 8/2008 | Floyd et al. | |

(Continued)

FOREIGN PATENT DOCUMENTS

EP  1428908 B1  6/2004
EP  1686199 A3  8/2006

(Continued)

*Primary Examiner* — Maria Veronica Ewald
*Assistant Examiner* — Laura Auer
(74) *Attorney, Agent, or Firm* — Mitchell D. Bittman

(57) ABSTRACT

A tri-barrier ceramic coating system is provided having a base thermal barrier layer, an intermediate CMAS barrier layer, and a top erosion barrier layer, and the method of applying such a coating system to a substrate. The base layer has a typical columnar structure with inter-columnar gaps and intra-columnar micro-pores that provides the stress tolerance during thermal cycles. The intermediate CMAS barrier layer has the fiber-like columns with inter-columnar nano-pores and a grid structure on the bottom of the layer. The fine structured intermediate layer covers the gaps between the columns of the base layer and will block CMAS infiltration effectively. The top erosion resistant layer contains wider TBC columns with narrow inter-columnar gaps and a modified cauliflower-like TBC head that provides erosion resistance for the underlying layers. The tri-barrier coating microstructure will further reduce the thermal conductivity as comparing to the conventional single layer system.

19 Claims, 4 Drawing Sheets

1

(56) References Cited

U.S. PATENT DOCUMENTS

| | | |
|---|---|---|
| 7,597,966 B2 | 10/2009 | Spitsberg et al. |
| 7,666,528 B2 | 2/2010 | Hazel et al. |
| 2005/0153160 A1* | 7/2005 | Liu et al. .................. 428/633 |
| 2005/0244663 A1 | 11/2005 | Ulion et al. |
| 2006/0019119 A1 | 1/2006 | Spitsberg et al. |
| 2006/0280926 A1* | 12/2006 | Spitsberg et al. .......... 428/304.4 |
| 2007/0087210 A1 | 4/2007 | Sahoo et al. |
| 2008/0145674 A1* | 6/2008 | Darolia et al. .................. 428/433 |
| 2013/0122259 A1* | 5/2013 | Lee .................................. 428/164 |

FOREIGN PATENT DOCUMENTS

| | | |
|---|---|---|
| EP | 2108715 A2 | 10/2009 |
| WO | WO 97/01436 A1 | 1/1997 |
| WO | WO 2009/091721 A2 | 7/2009 |
| WO | WO 2009/125204 A1 | 10/2009 |

* cited by examiner

TRI-BARRIER CERAMIC COATING

FIELD OF THE INVENTION

This invention relates to a thermal barrier coating for components that are exposed to the hostile gas turbine engine operation environment. More particularly, this invention relates to a thermal, CMAS and erosion tri-barrier ceramic coating system designed to protect turbine engine hot section components against CMAS and erosion attack, while having increased thermal protection. In addition, this invention provides a specific method of applying the tri-barrier coating system.

BACKGROUND OF THE INVENTION

In advanced turbine engines, combustion chamber temperatures may exceed 2400 degrees F. in order to increase the power output of the engine for high thrust and high efficiency. At the desired high temperature, the components in the hot engine section made of a Ni or Co based superalloy, even the advanced directionally solidified or single crystal nickel-based superalloys, will lose its load carrying function due to their mechanical strength being weakened due to overheating. The most advanced metallic coatings such as a McrAlY or platinum aluminized coating, which are applied onto the Ni or Co based superalloy turbine blades and vanes, are not adequate in protecting the superalloy article from oxidation since at this elevated temperature the metallic coating will oxidize at a very fast rate. In addition, these metallic coatings do not offer a sufficient thermal barrier to protect the superalloy article from overheating. The high operating temperatures have required the employment of thermal barrier coatings to protect both the base alloy and metallic coating from overheating, oxidation, erosion and corrosion etc. in the hostile operating environment of the engine which contains oxygen, abrasive particles and various contaminants.

Thermal barrier ceramic coatings are generally applied onto a bond coat that may be a simple aluminized or platinum aluminized coating or a MCrAlY coating, wherein M is Ni, Co and/or Fe, by air thermal spray (APS) or by electron beam physical vapor deposition (EBPVD). The most common thermal barrier coating material is a zirconia-based matrix with the addition of stabilizers such as yttria, calcia, magnesia, scandia, or halfnia. Some advanced thermal barrier coatings ("TBC"), consist of zirconia and/or halfnia based matrix with at least one dopant selected from rare earth oxides in the lanthanide group such as La, Ce, Pr, Nd, Pm, Sm, Eu, Gd, Tb, Dy, Ho, Er, Tm, or Yb, have been developed to achieve a higher thermal insulation with a lower thermal conductivity than the typical 7 wt. % yttria stabilized zirconia (7YSZ). The typical microstructure of an air plasma sprayed ("APS") TBC predominantly is lamellar splats with anisotropic distribution of inter-splat lamellar pores that are mostly parallel to substrate and intra-splat cracks that are mostly perpendicular to substrate, as well as globular pores in various sizes. The typical microstructure of an electron beam physical vapor deposition ("EBPVD") TBC is columnar grains with gaps between the columns and a feathery structure with intra-columnar micro pores. The columnar structure of EBPVD TBC allows the TBC to expand and contract without developing stress within itself during thermal cycling, which is the main reason that the EBPVD TBC exhibits a much longer lifetime than APS TBC.

Over the years, it has been recognized that further improvements to EBPVD TBC systems are needed to increase the lifetime of the coating system. Observations and failure investigations of overhauled engine blades and vanes have demonstrated that the TBC deterioration is primarily caused by CMAS and erosion attack. CMAS is a calcia-magnesia-alumina-silicate deposit originated from the ingestion of dust, sand, volcanic ashes, and runway debris with the intake of air in gas turbine engines. These CMAS elements deposit onto the surface of the TBC. At temperature in excess of 2100° F. during engine operation, these CMAS elements will melt and infiltrate into the gaps between the EBPVD TBC columns. When the engine shuts and cools down, the CMAS composites solidify into a fully dense domain and initiate large compressive stress within the TBC while it is contracting. When the compressive stress becomes too large, it causes a layer of the TBC to spall off at the depth of the CMAS penetration. Once the TBC is removed locally or entirely by CMAS attack, the bond coat and base alloy are subjected to high temperature-induced deterioration.

Erosion is a wear process that initiates when ingested particles such as sand, carbon from fuel combustion products, TBC coating particles from the combustion chamber and other foreign material impinge upon the TBC layer. The erodents in the high velocity gas stream strike the surface of turbine blades and vanes and remove the TBC. In the recent decades, low thermal conductivity TBCs ("low K TBC") have been developed to meet the demand for increasing gas turbine operation temperatures. While lowering thermal conductivity of TBC is achieved either by modifying microstructure to incorporate more pores and cracks or by doping rare earth oxides into a zirconia matrix to form ternary or quaternary oxides, the erosion resistance of low K TBCs was ultimately sacrificed. To date, both EBPVD and APS low K TBCs have exhibited a higher erosion rate than the conventional 7YSZ TBC.

Efforts have been made to improve either erosion or CMAS resistance. U.S. Pat. No. 5,350,599 discloses an erosion resistant dense top layer produced by either halting or slowing the rotation while continuing deposition in order to make a densified layer. U.S. Pat. No. 5,683,825 discloses an erosion-resistant composition with Al2O3 or SiC dispersed within or overlaying the ceramic TBC layer. U.S. Pat. No. 5,714,202 discloses a diamond film deposited over columnar thermal barrier coatings for improving the erosion resistance. U.S. Pat. Nos. 5,792,521 and 6,054,184 disclose an alternative multilayer coating consists of a layer of 7YSZ for thermal insulation and a layer of Al2O3 for erosion resistance applied by sequentially deflecting an electronic beam at different ceramic ingots or use of a baffle to control vapor exposure. International Patent WO97/01436 discloses a continuous first sacrificial oxide or impermeable layer chosen from a metal oxide, metal carbide, metal nitride, metal silicate, or a precious metal on the outer surface of TBC combined with a top layer of non-wetting coating chosen from oxides, carbides, nitrides and silicates to resist CMAS infiltration and its reaction with the TBC.

SUMMARY OF THE INVENTION

A tri-barrier coating system is provided comprising a base thermal barrier layer, an intermediate CMAS barrier layer and a top erosion barrier layer, with or without a bond coat underneath the tri-barrier coating, and a method of applying such a coating system onto the components that are exposed to the hostile environment in aircraft and heavy industrial gas turbine engines.

DETAILED DESCRIPTION OF THE INVENTION

Figure 1:
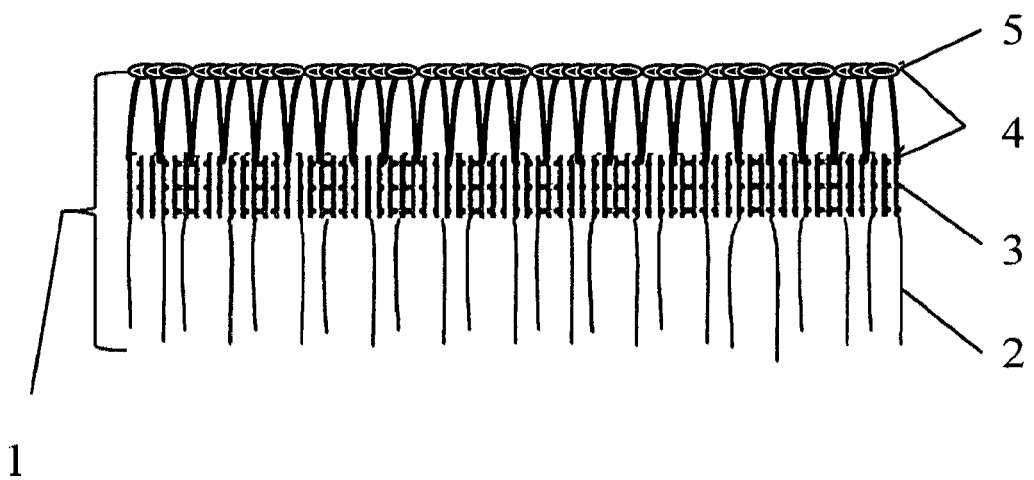
FIG. 1 is a drawing of the microstructure of the tri-barrier ceramic coating showing the three layers.
Figure 2:
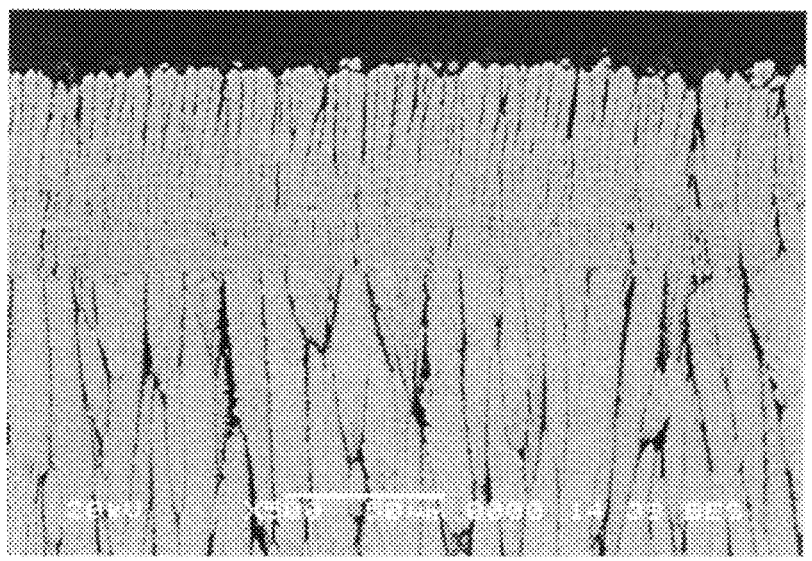
FIG. 2 is a photomicrograph of the microstructure at a magnification of 500× of the tri-barrier ceramic coating showing the three layers.

As shown in FIGS. 1 and 2, a tri-barrier coating system 1 is provided comprising a base thermal barrier layer 2, an intermediate CMAS barrier layer 3 and a top erosion barrier layer 4, with or without a bond coat underneath the tri-barrier coating.

The base layer 2 is a thermal barrier layer which has a columnar structure with gaps between the columns. Within each column, it contains feather-like sub-layers that are oriented at 40° to 50° to the column axis with intra-column pores. The width of the columns, as well as the gaps between the columns, becomes wider from the bottom to the top gradually. Based on the growth of the width of the columns, there will be fewer columns at the top of the base layer than at the beginning of the base layer. The columns could be straight from the bottom to top or a zigzag microstructure. The typical mean columnar width of the base layer is about 10 μm to 25 μm and the gaps between the columns are in the range of about 0.2 to 4.0 μm wide. This layer provides thermal insulation and strain tolerance during thermal cycles. The base layer 2 is finished to provide a smooth surface for the intermediate layer to be applied. The smooth outer surface of the base layer columns is required for development of the microstructure of the CMAS barrier layer. This finishing can be carried out by cooling the base layer after EBPVD application to close the gaps in the surface, or preferably by polishing the surface of the base layer which creates a smooth, even surface for the CMAS barrier layer to be applied. Polishing is preferably carried out to a surface roughness of about Ra 20 to 100 micro-inches.

Figure 3:
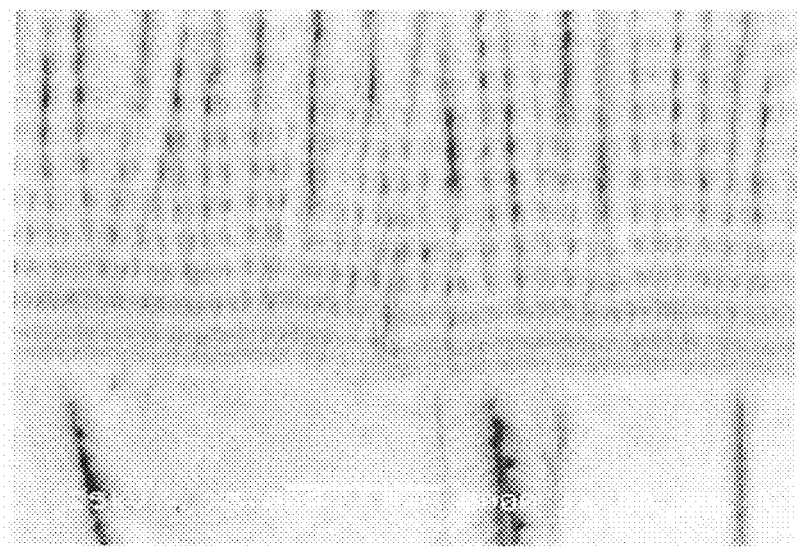
FIG. 3 is a photomicrograph of the microstructure at a magnification of 5,000× showing the intermediate CMAS layer of the tri-barrier ceramic coating.

The intermediate layer 3 is a CMAS barrier layer which contains fiber-like columns with inter-column nano-pores on the top and a grid structure on the bottom of the layer, see FIG. 3. The fiber-like column width is about 0.1 to 4.0 μm, preferably about 0.1 to 2.0 μM. The nano-pores between the fiber-like columns are about 50 to 250 nm wide, preferably about 50 to 150 nm. The grid structure at the bottom is formed by intersecting the fiber-like TBC columns with about 0.5 μm thick layers that are parallel to substrate surface. This finer microstructure with grid format (crosshatch structure) will effectively block CMAS infiltration.

Figure 4:
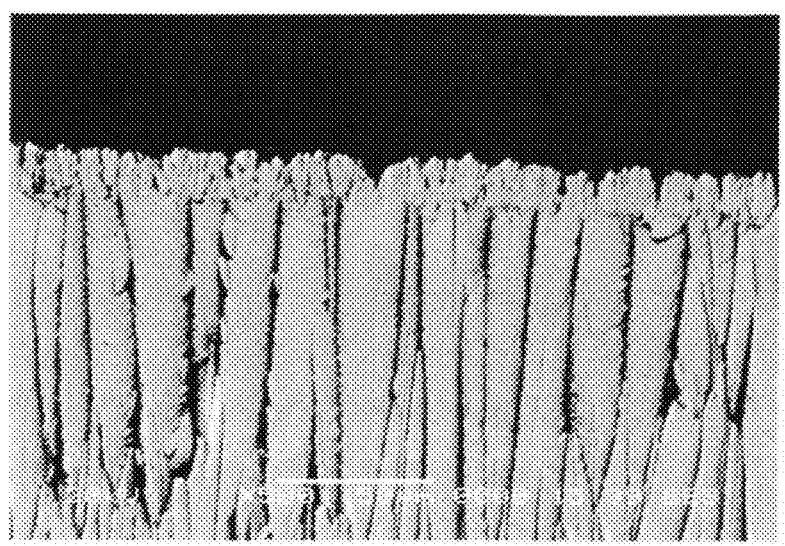
FIG. 4 is a photomicrograph of the microstructure at a magnification of 500× showing the top erosion resistant layer of the tri-barrier ceramic coating with a cauliflower-like accumulation at the surface of the top erosion resistant layer.

The top erosion resistant layer 4 contains a body of wider TBC columns with narrow gaps between the columns and preferably wherein the top of the columns 5 are modified, see FIG. 4. The top layer column width is in the range of about 2.5 to 15 μm, preferably about 4.0 to 10 μm, which is wider than the intermediate layer, with narrow gaps between the columns in the range of about 0.1 to 1.0 μm, preferably about 0.2 to 0.6 μm, which is narrower than the gaps of typical EBPVD TBC columns in the base layer. The top surface (head) of each top layer column 5 is preferably modified into a cauliflower-like accumulation (a close packed dense accumulation) of fine sub-columns, see FIG. 4. These cauliflower-like TBC heads 5 preferably have a size in the range of about 1 to 2 um and have no gaps between the columns or gaps between the columns of less than 0.5 um. These cauliflower-like TBC heads 5 are either connected to one another or grown along each column itself and provide erosion resistance. The narrow gaps between the columns will also help prevent the CMAS elements from migrating down to the CMAS resistant layer. In addition, the narrower gaps will make it more difficult for the small erosion particles from wedging in between the columns causing stresses when the columns expand when heated and contract when cooled which causes spallation where the particles are wedged, eroding away the top layer. Since each layer retains a columnar grained microstructure, it is expected that the tri-barrier will not compromise the lifetime of the coating system when each layer is within a certain thickness range. Further, the tri-barrier coating will provide additional reductions in thermal conductivity as comparing to a single layer.

The base layer is a typical zirconia/or hafnia based matrix with the additions of stabilizers like yttria, calcia, magnesia, scandia, hafnia or other oxides such as rare earth oxides from the lanthanide group such as La, Ce, Pr, Nd, Pm, Sm, Eu, Gd, Tb, Dy, Ho, Er, Tm, or Yb to protect the component substrate against over temperature exposure. The intermediate layer may or may not be the same chemistry as the base layer to protect the base layer against CMAS attack. The top layer may or may not be the same chemistry as the base layer or the middle layer to protect the underlying layers against high velocity erodent attack. Suitable ceramic materials include YSZ and $Nd_xZr_{1-x}O_y$ with Z dissolved in, where $0<x<0.5$, $1.75<y<2$ and Z is an oxide of a metal selected from Y, Mg, Ca, Hf and mixtures thereof. The thickness of the base layer is in the range of about 1 to 30 mils (25 μm to 600 μm), preferably about 5 to 16 mils (125 μm to 400 μm). The intermediate layer is at least about 0.2 mil (5 μm) in thickness, preferably about 0.5 mil to 3.0 mil (12.5 μm to 75 μm). The top layer is at least about 0.5 mils (12.5 μm) thick, preferably about 0.5 to 3.0 mil (12.5 μm to 75 μm).

The tri-barrier ceramic coating is applied to a substrate as follows: deposit the base layer to a desired thickness using regular EBPVD parameters (e.g. rotation of 6 rpm to 30 rpm and gun power of about 2.0 to 2.5 Amps to maintain a coating tank temperature of 1800° F.±100° F.); cool down the base layer to room temperature to shrink the heads of the columns; polish away the heads of columns of the base layer to a surface roughness of about Ra 20 to 100 micro-inch, preferably about Ra 30 to 50 micro-inch; deposit the intermediate CMAS layer with low rotation rate of 1 to 5 rpm and low gun power (about 1.8 Amps to maintain coating tank temperature around 1600° F.±50° F.); coat the top erosion resistance top layer subsequently with reverse rotation and a low rotation rate of 1 to 5 rpm combined with a high electron beam power (2.5 to 2.8 Amps or a narrow down gun beam to maintain coating tank temperature around 1950° F.±50° F.); followed by decreasing gun power (to 0.5 to 1.0 Amps to maintain a coating tank temperature of 1300° F.±50° F.) for about 2 to 8 minutes, followed by coating at standard gun power (2.0 to 2.5 Amps to maintain a coating tank temperature of 1800° F.±100° F.) with normal rotation rate (6 rpm to 30 rpm) for regular coating for about 2 to 10 minutes to achieve the top layer with modified cauliflower-like TBC head.

The tri-barrier TBC system provides three functions, as a thermal barrier, a CMAS barrier and an erosion barrier in one TBC system. The improvements include: a CMAS resistant layer that will prevent the CMAS elements from penetrating the base layer thereby increasing the lifetime of the TBC system; an erosion resistant layer on top of the CMAS resistant layer that will increase the lifetime of the TBC system by having a TBC microstructure at the surface of the coating system that provides the layers underneath with resistance to erosion; and by further reducing thermal conductivity of the TBC system as a result of the layered structure.

The tri-barrier TBC system also has the advantage of a lower cost method of applying a thermal barrier coating with both CMAS and erosion resistant layers. Prior art thermal barrier coatings generally either address providing a CMAS resistant layer or erosion resistant layer or require a separate coating operation to achieve a CMAS resistant layer or an erosion resistant layer. This tri-barrier thermal barrier ceramic coating system provides both a CMAS resistant layer and an erosion resistant layer and can be implemented without incurring any costs for additional equipment by utilizing a single EBPVD coating machine.

The tri-barrier coating system is applicable to heavy industrial and aero turbine engine components, including blades, vanes, seals, and combustion chamber components, as heavy industrial and aero engine components are all subjected to CMAS and erosion attack. Addressing these issues is critical to increasing the lifetime of the TBC system.

EXAMPLE

The tri-barrier coating was applied to nickel based super alloy surface as follows: a NiCoCrAlYHfSi bond coat was first applied to the alloy; a base thermal barrier layer of $Nd_{0.1}Zr_{0.9}O_{1.95}$ with Y and Hf dissolved in (see U.S. Pat. No. 7,041,383) was applied to the bond coat surface by EBPVD with a rotation rate of 6 rpm and a gun power of 2.2 to 2.4 Amps (coating tank temperature of 1800° F.) creating a TBC layer 9 mils thick with a mean columnar width of 10 to 25 μm with gaps between the columns of 0.2 to 4 μm; the base thermal barrier layer was cooled to ambient temperature then polished to a surface roughness of Ra 30 mirco-inch; an intermediate CMAS barrier layer of $Nd_{0.1}Zr_{0.9}O_{1.95}$ with $Y_2O_3$ and $HfO_2$ dissolved in was applied to the surface of the base layer by EBPVD with a rotation rate of 2 rpm and a gun power of 1.8 Amps (coating tank temperature of 1600° F.) creating a TBC layer 1 mil thick with inter columnar nano pores on the top and a grid like structure on the bottom of the intermediate layer with a mean columnar width of 0.6 to 1.0 μm with nano pores between the columns of 60 to 250 nm; and a top erosion resistant layer of $Nd_{0.1}Zr_{0.9}O_{1.95}$ with $Y_2O_3$ and $HfO_2$ dissolved in was applied to the surface of the intermediate layer by EBPVD with a reverse rotation rate of 2 rpm and a gun power of 2.6 Amps (coating tank temperature of 1950° F.) creating a TBC layer 2.5 mils thick with a mean columnar width of 2.5 to 10 μm with narrower gaps between the columns of 0.1 to 1.0 μm, with the surface of the top layer being modified into a cauliflower-like accumulation of fine sub-columns by decreasing the gun power to 0.5 Amps (coating tank temperature of 1300° F.) for 5 mins followed by coating at standard rotation of 6 rpm and a gun power of 2.2 to 2.4 Amps (coating tank temperature of 1800° F.) for 4.2 mins.

The erosion rate of the tri-barrier coating was measured against a thermal barrier coating applied as a single layer TBC (applied by the same process as the base layer applied above, without polishing). The thermal barrier coating material used for both coatings was a $Nd_{0.1}Zr_{0.9}O_{1.95}$ with Y and Hf dissolved in (see U.S. Pat. No. 7,041,383). The erosion test was carried out in a grit blast erosion apparatus in which erodent is fed into a stream of compressed air, with accelerated erodent leaving a nozzle placed perpendicularly in the holding fixture and striking the test sample that is placed on a horizontal plate. The erodent used was 27 μm irregular alumina which impacted the surface of the coating at 90 degrees with a constant feed rate of 2.25 to 2.31 g/min and a mean air pressure of 75 psi. The diameter of the nozzle was 1.2 mm and the distance from the nozzle exit to coating surface was 8 to 10 mm. The coating's weight before and after erosion wear was measured. Erosion rate is defined as the mass of TBC coating removed (weight loss)/mass of erosive particles. The test was repeated to obtain the average of erosion rate of each type of sample. The tri-barrier coating exhibited an erosion rate of 42%-54% of the erosion rate of the single layer TBC.

What is claimed is:

1. A tri-barrier ceramic coating for a substrate comprising:
    a base thermal barrier ceramic coating layer having a columnar structure with inter-columnar gaps and intra-columnar micro-pores, said thermal barrier coating layer being finished after application to create a smooth surface;
    an intermediate CMAS barrier ceramic layer having fiber-like columns with inter-columnar nano-pores and a grid structure formed by intersecting fiber like columns with layers of the CMAS barrier layer being parallel to the substrate surface, wherein the intermediate CMAS barrier ceramic layer is on the base thermal barrier ceramic coating layer; and
    a top erosion resistant barrier ceramic layer having wider columns with narrow inter-columnar gaps, wherein the columns are wider than the intermediate layer, and have narrower inter column gaps than the base layer.

2. Coating of claim 1 wherein the top erosion resistant barrier layer at its top surface has a close packed dense accumulation of columns.

3. Coating of claim 2 wherein the base thermal barrier layer is polished after application to create a smooth surface.

4. Coating of claim 3 further comprising a bond coat on the substrate surface with the base layer on the bond coat surface.

5. Coating of claim 4 wherein the bond coat is selected from the group consisting of aluminide, platinum aluminide and MCrAlY wherein M is Ni, Co, Fe or combination thereof.

6. Coating of claim 1 wherein the base layer has a column width of about 10 to 25 μm and a gap between the columns of about 0.2 to 4 μm wide.

7. Coating of claim 6 wherein the intermediate layer has a column width of about 0.1 to 4 μm and the nano-pores between the columns of about 50 to 250 nm wide.

8. Coating of claim 7 wherein the top layer has a column width of about 2.5 to 15 μm and a gap between the columns of about 0.1 to 1.0 μm wide.

9. Coating of claim 8 wherein the base layer is about 25 to 600 μm thick, the intermediate layer is at least 5 μm thick and the top layer is at least 12.5 μm thick.

10. Coating of claim 3 wherein the base layer is polished to a surface roughness of an Ra of about 20 to 100 micro-inches.

11. Coating of claim 4 wherein the ceramic coating is a $Nd_xZr_{1-x}O_y$ with Z dissolved in, where $0<x<0.5$, $1.75<y<2$ and Z is an oxide of a metal selected from Y, Mg, Ca, Hf and mixtures thereof.

12. Process of applying a thermal barrier coating for an underlying substrate comprising:
    applying by electron beam physical vapor deposition a base thermal barrier ceramic coating layer having a columnar structure with inter-columnar gaps and intra-columnar micro-pores;
    finishing the base layer to create a smooth surface;
    applying by electron beam physical vapor deposition an intermediate CMAS barrier ceramic layer having fiber-like columns with inter-columnar nano-pores and a grid structure formed by intersecting fiber like columns with layers parallel to the substrate surface; and
    applying by electron beam physical vapor deposition a top erosion resistant barrier ceramic layer having wider columns with narrow inter-columnar gaps, wherein the columns are wider than the intermediate layer, and have narrower inter column gaps than the base layer.

13. Process of claim 12 further comprising applying at the top surface of erosion resistant barrier layer a close packed dense accumulation of columns.

14. Process of claim 13 wherein the base layer is finished by polishing.

15. Process of claim 14 wherein the base layer is polished to a surface roughness of an Ra of about 20 to 100 microinches.

16. Process of claim 15 wherein deposition of the intermediate layer is carried out with a rotation rate of 1 to 5 rpm and a gun power to maintain a coating tank temperature of about 1600° F.±50° F.

17. Process of claim 16 wherein deposition of the top layer is carried out by reversing rotation of the substrate, a rotation rate of 1 to 5 rpm and with a gun power to maintain a coating tank temperature of 1950° F.±50° F.

18. Process of claim 17 further comprising decreasing the gun power to maintain a coating tank temperature of 1300° F.±50° F., followed by a rotation rate of 6 to 30 rpm and a gun power to maintain a coating tank temperature of about 1800° F.±50° F. to provide a top layer with a top surface with a close packed dense accumulation of columns.

19. Process of claim 18 wherein deposition of the base layer is carried out with a rotation rate of 6 to 30 rpm and a gun power to maintain a coating tank temperature of about 1800° F.±50° F.

\* \* \* \* \*